United States Patent
Koyama

(10) Patent No.: US 9,991,188 B2
(45) Date of Patent: Jun. 5, 2018

(54) ELECTRONIC COMPONENT COOLER

(71) Applicant: FUJI ELECTRIC CO., LTD., Kawasaki-shi, Kanagawa (JP)

(72) Inventor: Takahiro Koyama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days. days.

(21) Appl. No.: 15/287,870

(22) Filed: Oct. 7, 2016

(65) Prior Publication Data

US 2017/0025326 A1 Jan. 26, 2017

Related U.S. Application Data

(63) Continuation of application No. PCT/JP2015/073578, filed on Aug. 21, 2015.

(30) Foreign Application Priority Data

Sep. 22, 2014 (JP) .................................. 2014-192123

(51) Int. Cl.
*H01L 23/473* (2006.01)
*H01L 23/367* (2006.01)
(Continued)

(52) U.S. Cl.
CPC ........ *H01L 23/473* (2013.01); *H01L 23/3675* (2013.01); *F28D 15/0266* (2013.01); *H01L 23/427* (2013.01); *H01L 2924/0002* (2013.01)

(58) Field of Classification Search
CPC . H01L 23/473; H01L 23/3675; H01L 23/427; H01L 2924/0002; F28D 15/0266
(Continued)

(56) References Cited

U.S. PATENT DOCUMENTS

| | | | |
|---|---|---|---|
| 5,275,237 A * | 1/1994 | Rolfson | F28F 3/12 165/168 |
| 7,104,312 B2 * | 9/2006 | Goodson | F04B 19/006 165/104.33 |

(Continued)

FOREIGN PATENT DOCUMENTS

| | | |
|---|---|---|
| JP | 2005-45027 | 2/2005 |
| JP | 2008-172014 | 7/2008 |

(Continued)

OTHER PUBLICATIONS

International Search Report dated Oct. 20, 2015 in corresponding International Application No. PCT/JP2015/073578.

*Primary Examiner* — Jianying Atkisson
*Assistant Examiner* — Joel Attey

(57) ABSTRACT

A cooler with a cooler main body that, in one configuration, includes a first wall portion forming a cooling surface that cools an electronic component, a second wall portion disposed opposing the first wall portion, and a side wall portion that connects a periphery of the first wall portion and a periphery of the second wall portion. In the configuration, cooling fins are attached to an inner wall surface of the first wall portion, a refrigerant introduction pipe and refrigerant introduction flow path for supplying refrigerant to the cooling fins and a refrigerant discharge pipe and refrigerant discharge flow path for ejecting refrigerant from the cooling fins are included, and protruding portions and are provided on the first wall portion side of the refrigerant introduction flow path.

13 Claims, 4 Drawing Sheets

(51) Int. Cl.
*F28D 15/02* (2006.01)
*H01L 23/427* (2006.01)

(58) Field of Classification Search
USPC .......................................... 165/80.4, 104.33
See application file for complete search history.

(56) References Cited

U.S. PATENT DOCUMENTS

| | | | |
|---|---|---|---|
| 8,902,589 B2 | 12/2014 | Gohara et al. | |
| 2006/0185826 A1* | 8/2006 | Ohashi | F28D 15/0266 165/104.24 |
| 2010/0090336 A1* | 4/2010 | Yoshida | H01L 23/473 257/717 |

FOREIGN PATENT DOCUMENTS

| | | |
|---|---|---|
| JP | 2009-283559 | 12/2009 |
| JP | 2012-174963 | 9/2012 |
| JP | 2013-58518 | 3/2013 |
| WO | WO 2011/132736 A1 | 10/2011 |

\* cited by examiner

FIG. 2A  A-A' CROSS-SECTION
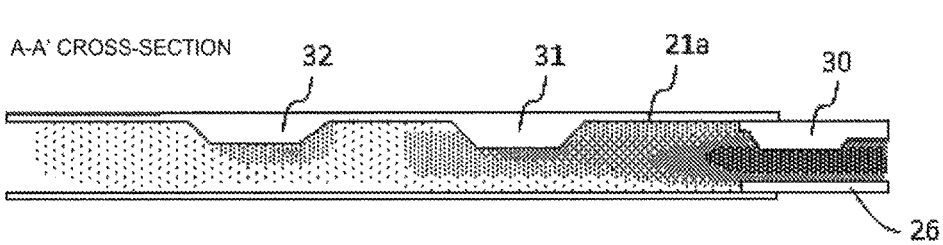
FIG. 2B  B-B' CROSS-SECTION
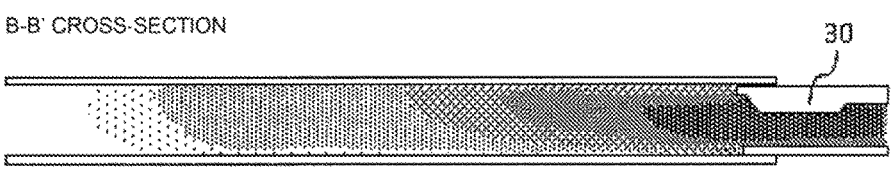
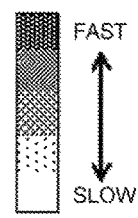

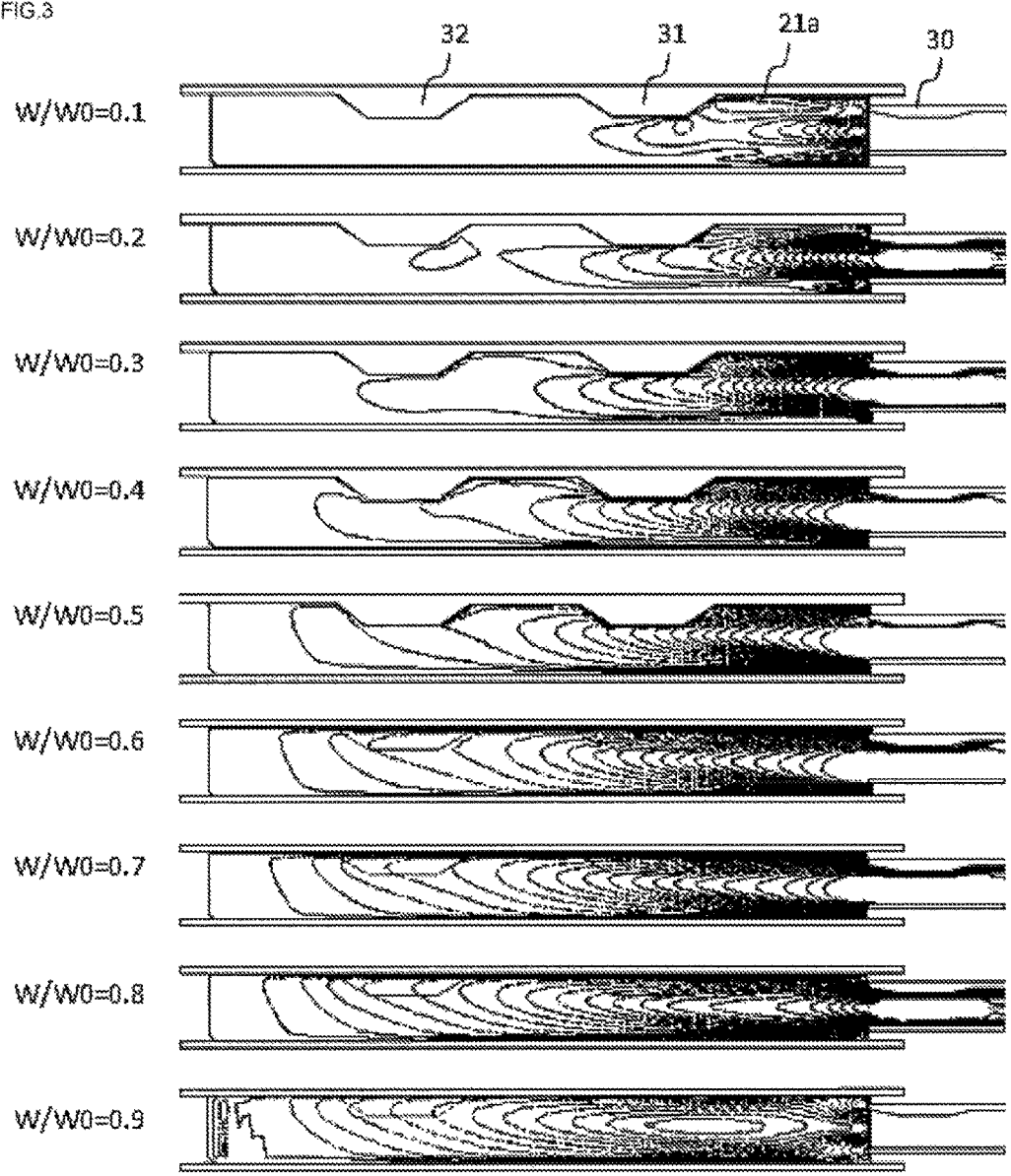

FIG.4
w/w0=0.1 
w/w0=0.2 
w/w0=0.3 
w/w0=0.4 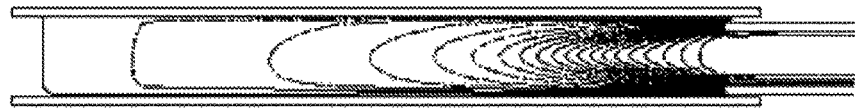
w/w0=0.5 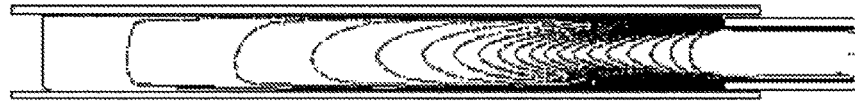
w/w0=0.6 
w/w0=0.7 
w/w0=0.8 
w/w0=0.9 

ELECTRONIC COMPONENT COOLER

CROSS-REFERENCE TO RELATED APPLICATIONS

This application is a continuation application, filed under 35 U.S.C. § 111(a), of International Application PCT/JP2015/073578 filed on Aug. 21, 2015 and claims foreign priority to Japanese Patent Application No. 2014-192123, filed Sep. 22, 2014, the content of each of which is incorporated herein by reference in its entirety.

BACKGROUND

1. Field

The present disclosure relates to a cooler that cools an electronic component, and relates to a cooler wherein velocity distribution in a refrigerant introduction flow path is improved, thus increasing an electronic component cooling effect.

2. Related Art

The introduction of a power supply and motor which is used in an inverter circuit with high energy conversion efficiency, and a hybrid car, electric vehicle, or the like in which the power supply and motor are put to practical use, is accelerating with a view to realizing a low-carbon society. In these fields, an electronic component called a power semiconductor element, such as a rectifier diode, power MOSFET, IGBT, or thyristor, is used in large current control.

Although a power semiconductor element is designed in such a way that on-state resistance is lowered, an increase in the amount of heat generated in accompaniment to increased output is unavoidable, and coolers from air cooling types to liquid cooling types have already been employed in a semiconductor module in which a multiple of power semiconductor elements are mounted, and the like. This kind of cooler is such that various methods are implemented in order to increase cooling efficiency.

For example, a cooler characterized by including a cooling path that cools a cooled portion of an electronic component, an introduction flow path that introduces a cooling medium into the cooling path from an inlet, and an ejection flow path that ejects the cooling medium from the cooling path to an outlet, wherein a flow path area of at least one of the introduction flow path and ejection flow path is greater in a position farther than a predetermined position from the inlet or outlet than in the predetermined position, is disclosed in Japanese Application Publication JPA 2012-174963.

Also, a semiconductor module wherein a refrigerant is supplied from the exterior to a water jacket configuring a cooler, thereby cooling a semiconductor element disposed on an outer surface of the cooler, the semiconductor module being characterized by including a heat sink thermally connected to the semiconductor element, a first flow path in the water jacket extended from a refrigerant inlet and in which is disposed a guide portion having at least one inclined surface for leading the refrigerant toward one side surface of the heat sink and another surface, a second flow path disposed in the water jacket parallel to the first flow path, extended to a refrigerant outlet and in which is formed a side wall parallel to another side surface of the heat sink, and a third flow path formed in a position linking the first flow path and second flow path in the water jacket and in which is disposed the heat sink, is disclosed in International Application Publication WO 2011/132736.

SUMMARY

The technologies described in JPA 2012-174963 and WO 2011/132736 both have an aspect of correcting bias in an amount of refrigerant distributed from an introduction flow path to a cooling path disposed in parallel, thereby evenly cooling a cooled surface.

However, a method of improving velocity distribution in a refrigerant introduction flow path cross-section, thereby increasing cooling efficiency, is not discussed in the heretofore described existing technology.

Therefore, an aspect of the disclosure is to provide an electronic component cooler such that velocity distribution in a refrigerant introduction flow path cross-section is improved, thereby increasing cooling efficiency.

In order to achieve the heretofore described aspect, a cooler of the disclosure is characterized by including a cooler main body including a refrigerant flow path enclosed by a first wall portion of which an outer wall surface forms a cooling surface that cools an electronic component, a second wall portion disposed opposing the first wall portion, and a side wall portion, a plurality of cooling fins, provided in an intermediate portion of an inner wall of the first wall portion, that divide the refrigerant flow path into a refrigerant introduction flow path and a refrigerant discharge flow path, a refrigerant introduction pipe, provided in the side wall portion, positioned at one end of the refrigerant introduction flow path, a refrigerant discharge pipe connected to the refrigerant discharge flow path, and a first protruding portion provided in a portion of the first wall portion facing the refrigerant introduction flow path, wherein a flow path sectional area in the place in which the first protruding portion is provided is smaller than those before and after the first protruding portion.

The cooler of the disclosure may include a second protruding portion provided on an inner wall positioned on a first wall portion side of the refrigerant introduction pipe, wherein a flow path sectional area in the place in which the second protruding portion is provided is smaller than those before and after the second protruding portion.

The cooler of the disclosure may be such that the first protruding portion is disposed on an upstream side of refrigerant introduction side openings of the cooling fins disposed below the electronic component.

The cooler of the disclosure may be such that a width of the first protruding portion is 0.1 times or more, 0.5 times or less, a distance from the refrigerant introduction side openings of the cooling fins to the side wall portion.

The cooler of the disclosure may be such that the first protruding portion is in contact with the side wall portion of the refrigerant introduction flow path.

The cooler of the disclosure may be such that a surface of the first protruding portion opposing the second wall portion is a flat surface.

The cooler of the disclosure may be such that the refrigerant introduction flow path can include a plurality of the first protruding portions.

The cooler of the disclosure may be such that a width of the first protruding portion on an upstream side of the refrigerant introduction flow path is smaller than that of another of the first protruding portions on a downstream side of the refrigerant introduction flow path.

The cooler of the disclosure may be such that a length or height of the first protruding portion on an upstream side of the refrigerant introduction flow path is smaller than that of another of the first protruding portions on a downstream side of the refrigerant introduction flow path.

The cooler of the disclosure may be such that a volume of the first protruding portion on an upstream side of the refrigerant introduction flow path is smaller than that of another of the first protruding portions on a downstream side of the refrigerant introduction flow path.

According to the disclosure, using a protruding portion disposed on a cooling surface side of a refrigerant introduction flow path, velocity distribution can be formed so that a portion that comes into contact with the protruding portion is of a high velocity. Therefore, a portion of refrigerant flowing in from cooling fin refrigerant introduction side openings that comes into contact with a first wall portion forming a cooling surface can be caused to flow faster, because of which an electronic component cooling effect can be increased.

BRIEF DESCRIPTION OF THE DRAWINGS

These and/or other aspects and advantages will become apparent and more readily appreciated from the following description of the embodiments, taken in conjunction with the accompanying drawings of which:

FIGS. 2A-2B are schematic diagram showings an example of velocity distribution in a refrigerant introduction flow path of the cooler of the disclosure.

FIG. 3 is a diagram showing an example of velocity distribution in the cooler of the disclosure obtained by simulation.

FIG. 4 is a diagram showing an example of velocity distribution in an existing cooler obtained by simulation.

DESCRIPTION OF EMBODIMENTS

Figure 1A:
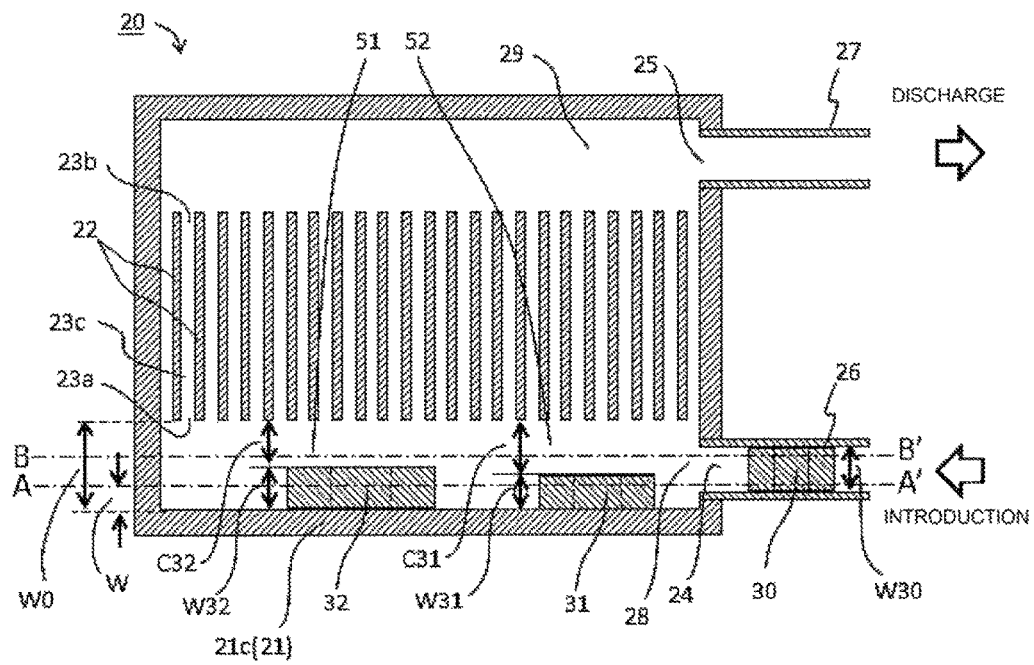
FIGS. 1A-1B are structural schematic diagrams showing an embodiment of a cooler of the disclosure.

Hereafter, referring to the drawings, a description will be given of an embodiment of an electronic component cooler according to the disclosure.

Figure 1B:
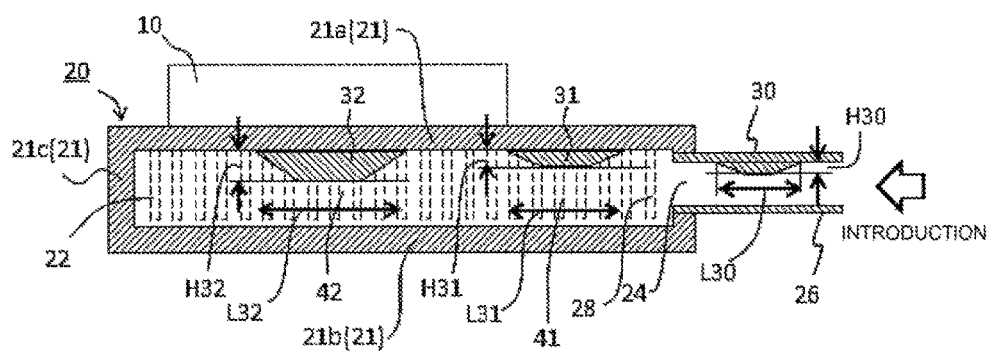

A plan view of the cooler is shown in FIG. 1A, and an A-A' sectional view of FIG. 1A is shown in FIG. 1B. A cooler 20 has a cooler main body 21 formed of a first wall portion 21a functioning as a cooling surface that cools an electronic component 10, a second wall portion 21b disposed opposing the first wall portion 21a, and a side wall portion 21c enclosing the first wall portion 21a and second wall portion 21b.

In order to effectively cool the electronic component 10, cooling fins 22 are attached to an internal surface of the first wall portion 21a. Any type of fin, such as a blade fin, corrugated fin, or pin fin, can be used as the cooling fin 22. Blade fins and corrugated fins may be of a straight form so as to form a straight flow path, but waving fins wherein the fins are caused to undulate in a wave form so that the flow path winds, or offset fins wherein the fins are divided in a longitudinal direction and arrayed with offsets in a horizontal direction, may be adopted. Cylindrical pins, columnar pins, or the like can be used as pin fin pins, and can be of a rectangular disposition or staggered disposition. In this embodiment, blade fins such that flat plates are aligned are employed as the cooling fins 22.

The first wall portion 21a and cooling fins 22 may be formed using a material with high thermal conductivity, for example, a metal material such as aluminum, an aluminum alloy, copper, or a copper alloy. The first wall portion 21a and cooling fins 22 may be integrally molded by welding or casting in order to increase thermal conductivity.

A space sandwiched by an array of refrigerant introduction side openings 23a of the cooling fins 22 of the cooler 20 and the side wall portion 21c of the cooler 20 forms a refrigerant introduction flow path 28. A refrigerant inlet 24 that penetrates the side wall portion 21c is provided at one end of the refrigerant introduction flow path 28, and a refrigerant introduction pipe 26 is connected to the refrigerant inlet 24.

Meanwhile, a space sandwiched by an array of refrigerant discharge side openings 23b of the cooling fins 22 and the side wall portion 21c of the cooler 20 forms a refrigerant discharge flow path 29 for collecting and ejecting refrigerant ejected from the refrigerant discharge side openings 23b of the cooling fins. A refrigerant outlet 25 is provided at one end (in this embodiment, on the same side as that of the refrigerant inlet 24) of the refrigerant discharge flow path 29, and a refrigerant discharge pipe 27 is connected to the refrigerant outlet 25. Note that the refrigerant outlet 25 may be in an end portion on the side opposite to that of the refrigerant inlet 24. Also, as it is sufficient that the refrigerant outlet 25 is provided in the side wall portion 21c in any place in the refrigerant discharge flow path 29, the refrigerant outlet 25 need not necessarily be in an end portion of the refrigerant discharge flow path 29.

The refrigerant introduction flow path 28 and refrigerant discharge flow path 29, not necessarily needing to be linear, may be curved. Note that the refrigerant introduction flow path 28 may be linear in a section in which it is wished to control velocity distribution. Large curving of the refrigerant introduction flow path 28 is not desirable, as a stationary portion caused by a vortex occurs.

A sectional form of the refrigerant introduction pipe 26 not being particularly limited, the refrigerant introduction pipe 26 can have a circular cross-section, a rectangular cross-section, or the like. An inner diameter of the refrigerant inlet 24, which forms an exit of the refrigerant introduction pipe 26, in a direction perpendicular to the first wall portion 21a and second wall portion 21b may be in a range of 0.5 to 1.0 times the size of an interval between the first wall portion 21a and second wall portion 21b. When the inner diameter of the refrigerant inlet 24 is smaller than heretofore mentioned, there is a possibility that control of velocity distribution in the refrigerant introduction flow path 28 will become difficult.

Protruding portions 31 and 32 of reverse trapezoidal form when seen from a side are disposed at a predetermined interval in the direction of flow of the refrigerant introduction flow path 28, adjacent to the side wall portion 21c, on an inner surface of the first wall portion 21a facing the refrigerant introduction flow path 28. Herein, the protruding portion 31, which is disposed on an upstream side of the refrigerant introduction flow path 28, may be disposed on the upstream side of the refrigerant introduction side openings 23a of the cooling fins disposed below the electronic component 10.

Also, in this embodiment, a protruding portion 30 that forms a trapezoid when seen from a side is also disposed on an inner surface on the first wall portion 21a side of the refrigerant introduction pipe 26.

By disposing the protruding portions 30, 31, and 32 in this way, the flow path sectional area in each place in which a protruding portion is disposed is constricted, becoming smaller than those before and after the protruding portion.

Heights H31 and H32 of the protruding portions 31 and 32, expressed as distances from the inner surface of the refrigerant introduction flow path 28 of the first wall portion 21a to apex portions of the protruding portions 31 and 32, may be in a range of 0.1 to 0.5 times or 0.3 to 0.5 times, the size of the interval between the first wall portion 21a and second wall portion 21b. No advantage appears when the heights H31 and H32 of the protruding portions 31 and 32 are smaller than 0.1 times the size of the interval between the first wall portion 21a and second wall portion 21b, and when the heights H31 and H32 are greater than 0.5 times the size of the interval between the first wall portion 21a and second wall portion 21b, velocity increases sharply due to the path becoming narrow, and control becomes difficult. The height H31 of the protruding portion 31 disposed on the upstream side in the direction of flow of the refrigerant introduction flow path 28 may be smaller than the height H32 of the protruding portion 32 disposed on the downstream side. The number of the protruding portions 31 and 32 disposed along the refrigerant introduction flow path 28 not being limited to two, there may be one or three or more, but in this case too, the height of a protruding portion on the upstream side of the refrigerant introduction flow path 28 may be smaller than the height of other protruding portions on the downstream side of the refrigerant introduction flow path 28.

Also, when seen in planar view, widths W31 and W32 of the protruding portions 31 and 32 are smaller than an interval between an inner surface of the side wall portion 21c and the refrigerant introduction side openings 23a of the cooling fins 22, because of which gaps 51 and 52 are formed between the protruding portions 31 and 32 and the refrigerant introduction side openings 23a of the cooling fins 22. The width W31 of the protruding portion 31 disposed on the upstream side in the direction of flow of the refrigerant introduction flow path 28 may be smaller than the width W32 of the protruding portion 32 disposed on the downstream side. Furthermore, the number of the protruding portions 31 and 32 disposed along the refrigerant introduction flow path 28 not being limited to two, there may be one or three or more, but in this case too, the width of a protruding portion on the upstream side of the refrigerant introduction flow path 28 may be smaller than the width of other protruding portions on the downstream side of the refrigerant introduction flow path 28. The widths W31 and W32 of the protruding portions 31 and 32 may be 0.1 times or more, 0.5 times or less a distance W0 from the refrigerant introduction side openings 23a to the side wall portion 21c. When providing one long protruding portion, the width may be nearer to 0.1 times the distance W0, and when providing a multiple of short protruding portions, the widths may be nearer to 0.5 times the distance W0. No advantage appears when the widths W31 and W32 of the protruding portions 31 and 32 are smaller than those heretofore mentioned, and when the widths W31 and W32 are greater than those heretofore mentioned, velocity increases due to the path becoming narrow, and control becomes difficult.

The refrigerant inlet 24, which forms the exit of the refrigerant introduction pipe 26, may be disposed, when seen in planar view, so as to be of an inner diameter and position such as to overlap the protruding portions 31 and 32 when extended in the direction of flow of the refrigerant introduction flow path 28. By so doing, refrigerant that passes through the refrigerant introduction pipe 26 and flows from the refrigerant inlet 24 can be caused to collide effectively with the protruding portions 31 and 32.

A length L31 of the protruding portion 31 disposed on the upstream side in the direction of flow of the refrigerant introduction flow path 28 may be smaller than a length L32 of the protruding portion 32 disposed on the downstream side. The number of the protruding portions 31 and 32 disposed along the refrigerant introduction flow path 28 not being limited to two, there may be one or three or more, but in this case too, the length of a protruding portion on the upstream side of the refrigerant introduction flow path 28 may be smaller than the length of other protruding portions on the downstream side of the refrigerant introduction flow path 28. Although the lengths L31 and L32 of the protruding portions 31 and 32 are not particularly limited, the total length of the two may be in a range of 0.3 to 0.7 times, or 0.5 times, the length of the refrigerant introduction flow path 28. No advantage appears when the total length is smaller than that heretofore mentioned, and when the total length is greater than that heretofore mentioned, control becomes difficult due to the path becoming narrow and velocity increasing.

When the cooler 20 has a multiple of protruding portions, the volume of a protruding portion on the upstream side of the refrigerant introduction flow path 28 may be caused to be smaller than that of other protruding portions on the downstream side of the refrigerant introduction flow path 28 by reducing the height, reducing the width, or reducing the length, and by the lengths, widths, heights, and setting positions of the protruding portions being regulated as appropriate, the electronic component 10 can be efficiently cooled, and an occurrence of a hot spot can be prevented.

The forms of the protruding portions 31 and 32, although not particularly limited, are preferably such that a surface opposing the second wall portion is a flat surface. Note that as the protruding portions 31 and 32 do not need to be of a form having the same height in a width direction, the protruding portions 31 and 32 may, for example, incline so that the height decreases toward the refrigerant introduction side opening 23a side of the cooling fins 22.

Meanwhile, as it is sufficient that the protruding portion 30 disposed in the refrigerant introduction pipe 26 is provided on an inner surface on the first wall portion 21a side, the form of the protruding portion 30 is not particularly limited, but may be such that a surface opposing the second wall portion is a flat surface. A height H30 of the protruding portion 30 may be in a range of 0.1 to 0.5 times, or 0.3 to 0.5 times, the inner diameter of the refrigerant introduction pipe 26 in a direction vertical to the first wall portion 21a and second wall portion 21b. No advantage is obtained when the height H30 of the protruding portion 30 is smaller than that heretofore mentioned, and when the height H30 is greater than that heretofore mentioned, velocity increases sharply, and pressure loss increases, due to the introduction pipe becoming narrow.

The disclosure is such that it is not essential to provide both the protruding portions 31 and 32 in the refrigerant introduction flow path 28 and the protruding portion 30 in the refrigerant introduction pipe 26. It is sufficient that a protruding portion is provided in either the refrigerant introduction flow path 28 or refrigerant introduction pipe 26. However, in order to efficiently cool the electronic component 10, the protruding portion may be disposed on the upstream side of the refrigerant introduction side openings 23a of the cooling fins disposed below the electronic component 10.

The cooler 20 of this disclosure may be used in cooling the electronic component 10, in particular, a semiconductor module in which is mounted a rectifier diode, power MOSFET, IGBT, thyristor, or the like, called a power semiconductor element. Joining of the electronic component 10 and first wall portion 21a can be carried out by, for example, directly joining a conductor layer formed on the back surface of a substrate of the electronic component 10 to the first wall portion 21a across a solder layer, or by joining the conductor layer formed on the back surface of the substrate to a base plate of aluminum or the like plated with copper or nickel, also across a solder layer, applying thermal grease to the back surface of the base plate, and pressing the base plate onto the first wall portion 21a of the cooler 20.

Next, a description will be given of an operational advantage of the cooler 20.

Owing to an unshown pump or the like, refrigerant passes through the refrigerant introduction pipe 26 and flows into the refrigerant introduction flow path 28 of the cooler 20. When the refrigerant passes through the refrigerant introduction pipe 26, the refrigerant comes into contact with the protruding portion 30 before the refrigerant inlet 24, and the velocity distribution changes. That is, the velocity is greater the nearer a portion is to the protruding portion 30, in other words, the nearer a portion is to the first wall portion 21a.

Then, the refrigerant that has flowed into the refrigerant introduction flow path 28 comes into contact with the two protruding portions 31 and 32, and the velocity distribution changes further. That is, the velocity is greater still the nearer a portion is to the protruding portions 31 and 32, in other words, the nearer a portion is to the first wall portion 21a. Also, in the process of passing along the refrigerant introduction flow path 28, the refrigerant flows sequentially into the refrigerant introduction side openings 23a of the cooling fins 22 aligned along the refrigerant introduction flow path 28, passes along refrigerant flow paths 23c of the cooling fins 22, and flows into the refrigerant discharge flow path 29.

At this time, the velocity distribution of the refrigerant in the refrigerant introduction flow path 28 changes because of the protruding portions 30, 31, and 32 so that the velocity is greater still the nearer a portion is to the first wall portion 21a, because of which the velocity also increases the nearer a portion is to the first wall portion 21a when the refrigerant passes along the refrigerant flow paths 23c of the cooling fins 22.

FIGS. 2A and 2B are schematic views wherein the heretofore described velocity distribution is visualized. FIG. 2A represents the velocity distribution in an A-A' cross-section that passes longitudinally through the protruding portions 30, 31, and 32 near the side wall portion 21c. Also, FIG. 2B represents the velocity distribution in a B-B' cross-section that passes longitudinally through the gaps 51 and 52 and the protruding portion 30 near the refrigerant introduction side openings 23a. In the drawings, velocity is represented by the darkness of hatching. That is, the darker the hatching, the faster the flow of refrigerant. As the flow becomes faster near a protruding portion, the hatching is drawn more darkly in the vicinity of the protruding portions 30, 31, and 32 in FIG. 2A. In FIG. 2B, refrigerant introduced from the refrigerant introduction pipe 26 is directed toward the first wall portion 21a by the action of the protruding portion, because of which the hatching trails upward, indicating that the velocity increases in a place in contact with the first wall portion 21a.

The operational advantage of the cooler of the disclosure can be shown visually by fluid analysis using a numerical calculation.

Electrical and electronic instrument thermal fluid analysis software ANSYS Icepak made by ANSYS is used in verifying the operational advantage of the cooler 20 shown in FIGS. 1A and 1B.

Calculation conditions for the verification are assumed to be:

(1) the cooler 20 is made of an Al material (A6063 material),
(2) one protruding portion 30 is disposed in the refrigerant introduction pipe 26,
(3) two protruding portions 31 and 32 of the same form are disposed in the refrigerant introduction flow path 28,
(4) the protruding portions 31 and 32 are in contact with the side wall portion 21c,
(5) the width of the protruding portions 31 and 32 is 0.5 times the distance from the refrigerant introduction side openings 23a to the side wall portion 21c, and
(6) the refrigerant is formed of a mixture wherein the ratio by volume of ethylene glycol to water is 50:50.

FIG. 3 is a diagram wherein, with regard to the cooler of the disclosure, the velocity distribution of the A-A' cross-section positioned a distance W from the side wall portion 21c is represented by contours of 0.2 m/s intervals in positions wherein W/W0=0.1, 0.2, 0.3, 0.4, 0.5, 0.6, 0.7, 0.8, and 0.9. The protruding portions 31 and 32 are disposed in a space wherein the distance from the side wall portion 21c is W/W0=0 to 0.5, the contours are concentrated in the vicinities of the surfaces of the protruding portions 31 and 32, and the velocity gradient is steep. Also, the outline of the contours heads toward the first wall portion 21a behind the protruding portions 31 and 32. Meanwhile, although there is no protruding portion in a space wherein W/W0=0.5 to 1, the outline of the contours heads toward the first wall portion 21a behind the protruding portions 31 and 32, in the same way as with the velocity distribution in the space wherein W/W0=0 to 0.5, and velocity distribution wherein a high velocity portion is biased to the first wall portion 21a side is formed. The first wall portion 21a is effectively cooled by the velocity distribution wherein a high velocity portion is biased to the first wall portion 21a side.

As opposed to this, FIG. 4 is a diagram wherein the velocity distribution of an existing cooler that has no protruding portion is represented by contours of 0.2 m/s intervals in cross-sections in nine places. In each cross-section, the outline of the contours extends straight horizontally, and no special advantage of increasing cooling efficiency is recognized.

The operational advantage of the protruding portions in the cooler of the invention has also been confirmed by simulation.

REFERENCE SIGNS AND NUMERALS ARE AS FOLLOWS

10: Electronic component
20: Cooler
21: Cooler main body
21a: First wall portion
21b: Second wall portion
21c: Side wall portion
22: Cooling fin
23a: Refrigerant introduction side opening of cooling fin
23b: Refrigerant discharge side opening of cooling fin
23c: Refrigerant flow path
24: Refrigerant inlet
25: Refrigerant outlet
26: Refrigerant introduction pipe
27: Refrigerant discharge pipe
28: Refrigerant introduction flow path
29: Refrigerant discharge flow path
30, 31, 32: Protruding portion 41, 42: Constriction of refrigerant introduction flow path immediately below protruding portion
51, 52: Gap
C30, C31, C32: Width of gap
H30, H31, H32: Height of protruding portion
L30, L31, L32: Length of protruding portion
W: Distance from side wall portion 21c to A-A' cross-section
W0: Distance from refrigerant introduction side opening 23a to side wall portion 21c
W30, W31, W32: Width of protruding portion Inclusion in this disclosure of any characterizations of any product or method of the related art does not imply or admit that such characterizations were known in the prior art even if the product or method itself was known in the prior art.

While the present disclosure has been particularly shown and described with reference to the embodiments thereof, it will be understood by those skilled in the art that the foregoing and other changes in form and details can be made therein without departing from the spirit and scope of the present disclosure.

What is claimed is:

1. A cooler, comprising:
a cooler main body including
a first wall portion enclosing a refrigerant flow path and having an outer wall surface that is a cooling surface adapted to cool an electronic component, the refrigerant flow path including a refrigerant introduction flow path and a refrigerant discharge flow path,
a second wall portion disposed opposing the first wall portion, and
a side wall portion;
a plurality of cooling fins, provided on a portion of an inner wall of the first wall portion, and provided in the refrigerant flow path between the refrigerant introduction flow path and the refrigerant discharge flow path, the plurality of cooling fins defining refrigerant flow paths, between the cooling fins, to pass refrigerant from the refrigerant introduction flow path to the refrigerant discharge flow path:
a refrigerant introduction pipe, provided in the side wall portion, positioned at one end of the refrigerant introduction flow path;
a refrigerant discharge pipe connected to the refrigerant discharge flow path; and
a first protruding portion protruding from a portion of the first wall portion facing a first section of the refrigerant introduction flow path, such that the first protruding portion constricts a flow path sectional area of the first section of the refrigerant introduction flow path to be smaller than flow path sectional areas of the refrigerant introduction flow path upstream to and downstream from the first section of the refrigerant introduction flow path, the first section of the refrigerant introduction flow path being upstream to inlets of a plurality of the refrigerant flow paths between the cooling fins.

2. The cooler according to claim 1, further comprising:
a second protruding portion protruding from a portion of an inner wall of the refrigerant introduction pipe on a same side as the first wall portion, such that a flow path sectional area at the second protruding portion is smaller than those upstream to and downstream from the second protruding portion.

3. The cooler according to claim 1, wherein the first protruding portion is disposed on an upstream side of refrigerant introduction side openings of the cooling fins.

4. The cooler according to claim 1, wherein a width of the first protruding portion is in a range of 0.1 to 0.5 times a distance from refrigerant introduction side openings of the cooling fins to the side wall portion.

5. The cooler according to claim 1, wherein the first protruding portion is in contact with the side wall portion of the refrigerant introduction flow path.

6. The cooler according to claim 1, wherein a surface of the first protruding portion opposing the second wall portion is a flat surface.

7. The cooler according to claim 1, wherein
the first protruding portion is among a plurality of protruding portions included in the refrigerant introduction flow path, and
each of the plurality of protruding portions protrude in a first direction from a respective portion of the first wall portion facing the refrigerant introduction flow path to thereby constrict a flow path sectional area of the refrigerant introduction flow path of a respective section of the refrigerant introduction flow path.

8. The cooler according to claim 7, wherein
the plurality of protruding portions include a second protruding portion located at a position downstream from the first protruding portion along the refrigerant introduction flow path,
the first protruding portion has a width in a second direction substantially parallel to the first wall portion and substantially perpendicular to the first direction, and
the width of the first protruding portion in the second direction is smaller than a width of the second protruding portion in the second direction.

9. The cooler according to claim 7, wherein
the plurality of protruding portions include a second protruding portion located at a position downstream from the first protruding portion along the refrigerant introduction flow path, and
a length or height of the first protruding portion is smaller than a length or height of the second protruding portion.

10. The cooler according to claim 8, wherein
the plurality of protruding portions include a second protruding portion located at a position downstream from the first protruding portion along the refrigerant introduction flow path, and
a length or height of the first protruding portion is smaller than a length or height of the second protruding portion.

11. The cooler according to claim 7, wherein
the plurality of protruding portions include a second protruding portion located at a position downstream from the first protruding portion along the refrigerant introduction flow path, and
a volume of the first protruding portion is less than that of the second protruding portion.

12. The cooler according to claim 1, wherein the first protruding portion is distanced from the plurality of cooling fins by a gap that is part of the refrigerant introduction flow path.

13. The cooler according to claim 8, wherein
the first protruding portion is distanced from the plurality of cooling fins by a first gap that is part of the refrigerant introduction flow path,
the second protruding portion is distanced from the plurality of cooling fins by a second gap that is part of the refrigerant introduction flow path, the second gap being narrower than the first gap.

* * * * *

UNITED STATES PATENT AND TRADEMARK OFFICE
CERTIFICATE OF CORRECTION

PATENT NO. : 9,991,188 B2  
APPLICATION NO. : 15/287870  
DATED : June 5, 2018  
INVENTOR(S) : Takahiro Koyama Page 1 of 1

It is certified that error appears in the above-identified patent and that said Letters Patent is hereby corrected as shown below:

On the Title Page

Item [*] (Notice), Line 14:  
After "0 days." delete "days.".

In the Claims

Column 9, Line 39:  
In Claim 1, delete "path:" and insert -- path; --, therefore.

Signed and Sealed this  
Fourteenth Day of August, 2018

Andrei Iancu  
*Director of the United States Patent and Trademark Office*